(12) United States Patent
Park (10) Patent No.: US 9,940,030 B2
(45) Date of Patent: Apr. 10, 2018

(54) MEMORY SYSTEM AND METHOD OF OPERATING THE SAME

(71) Applicant: SK hynix Inc., Icheon-si, Gyeonggi-do (KR)

(72) Inventor: Won Sun Park, Seoul (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 12 days.

(21) Appl. No.: 15/198,072

(22) Filed: Jun. 30, 2016

(65) Prior Publication Data

US 2017/0220251 A1 Aug. 3, 2017

(30) Foreign Application Priority Data

Jan. 28, 2016 (KR) .......................... 10-2016-0010894

(51) Int. Cl.
*G11C 7/00* (2006.01)
*G06F 3/06* (2006.01)

(52) U.S. Cl.
CPC ............ *G06F 3/061* (2013.01); *G06F 3/0604* (2013.01); *G06F 3/0659* (2013.01); *G06F 3/0688* (2013.01)

(58) Field of Classification Search
CPC ........... G11C 8/16; G11C 7/22; G11C 7/1075; G11C 7/1006; G11C 7/1051
USPC ............. 365/189.04, 189.05, 189.14, 189.15
See application file for complete search history.

(56) References Cited

U.S. PATENT DOCUMENTS 8,743,610 B2 * 6/2014 Kim .................... G06F 13/4243
365/185.11
2015/0301941 A1 * 10/2015 Jun ........................ G11C 16/10
711/103

FOREIGN PATENT DOCUMENTS

KR 1020090071446 A 7/2009

* cited by examiner

*Primary Examiner* — Son Dinh
(74) *Attorney, Agent, or Firm* — William Park & Associates Ltd.

(57) ABSTRACT

A memory system in accordance with an embodiment may include a memory chip and a controller. The memory chip may store data in a plurality of logical pages by performing a sensing operation on a selected page in response to commands and performing an output operation of the data. The controller may transmit the commands to the memory chip so that a part of the sensing operation and a part of the output operation are simultaneously performed.

20 Claims, 7 Drawing Sheets

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2016-0010894 filed on Jan. 28, 2016 in the Korean Intellectual Property Office, the entire disclosure of which is incorporated herein by reference.

BACKGROUND

1. Technical Field

An embodiment of the present invention generally relates to an integrated circuit, and more particularly to a memory system and a method of operating the same.

2. Related Art

Memory systems are widely used as data storage devices of digital devices such as a computer, a digital camera, an MP3 player, and a smartphone. The memory system may include a memory device for storing data and a controller for controlling the memory device. If the memory systems act as data storages for the digital devices, the controller transmits command, address, and data signals to the memory device.

Recently, the increasing data set size of applications being used at the digital devices is leading to an increase in demands for high-capacity data storage. As a result, the memory system has a plurality of memory chips or high-capacity memory chips. The memory chips communicate with the controller through a channel. For example, the plurality of memory chips may share a common communication channel.

Each memory chip includes a memory cell array storing data in a plurality of memory cells arranged therein. The memory cells may be single-level cells (SLC) capable of storing a single bit of data. The memory cells may also be multi-level cells (MLC), triple-level cells (TLC), or quadruple-level cells (QLC) capable of storing more than a single bit of data.

SUMMARY

A memory system according to an embodiment of the present invention may include a memory chip and a controller. The memory chip may perform a sensing operation on logical pages included in a selected page in response to a first command and simultaneously perform sensing operations on remaining logical pages of the selected page while outputting data of the logical pages having completed their sensing operations in response to a second command. The memory chip may update status/read (SR) information depending on what operations were performed. The controller may store the first command and the second command and to output the first command or the second command in accordance with the SR information.

A method of operating a memory system according to an embodiment of the present invention may include performing a sensing operation on a selected page by using read voltages having various levels and simultaneously performing sensing operations on remaining logical pages and an output operation of data of the logical pages having completed their sensing operations.

A method of operating a memory system according to an embodiment of the present invention may include performing a sensing operation on a plurality of logical pages in response to a read command, performing a sensing operation on remaining logical pages while outputting data of the logical pages having completed their sensing operation, and sequentially outputting the data of the remaining logical pages in response to setup commands and an output command.

According to various embodiments of the present invention, a sensing operation and an output operation may be simultaneously performed during a certain period of time in a read operation.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

Figure 1:
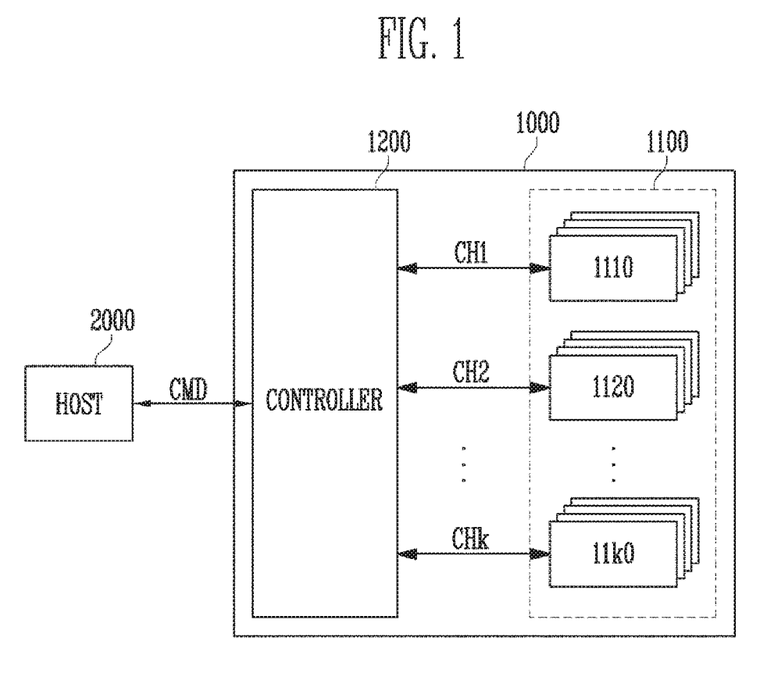
FIG. 1 is a diagram illustrating an example of a memory system according to an embodiment of the present invention.

FIG. 1 is a diagram illustrating an example of a memory system 1000 according to an embodiment of the present invention.

Referring to FIG. 1, the memory system 1000 may include a memory device 1100 for storing data and a controller 1200 for controlling the memory device 1100.

The memory device 1100 may include a plurality of memory groups 1110, 1120, and 11k0. Each of the memory groups 1110, 1120, and 11k0 may include a plurality of memory chips that communicate with the controller 1200 through channels CH1, CH2, . . . , and CHk (k is a positive integer).

When a command CMD is received from a host 2000, which request that the memory system 1000 perform read/write operations, the controller 1200 controls the memory groups 1110, 1120, and 11k0 through the channels CH1, CH2, . . . , and CHk in accordance with the received command CMD. Examples of the host 2000 may include a controller of a digital device that includes the memory system 1000. Alternatively, the host 2000 may be a separate device such as a host device. In an embodiment, although sensing operations have not been completed with respect to all logical pages during a read operation of a selected memory chip, the controller 1200 may output data read-out from sensing-operation-completed logical pages while sensing operations for remaining logical pages are being performed.

Figure 2:
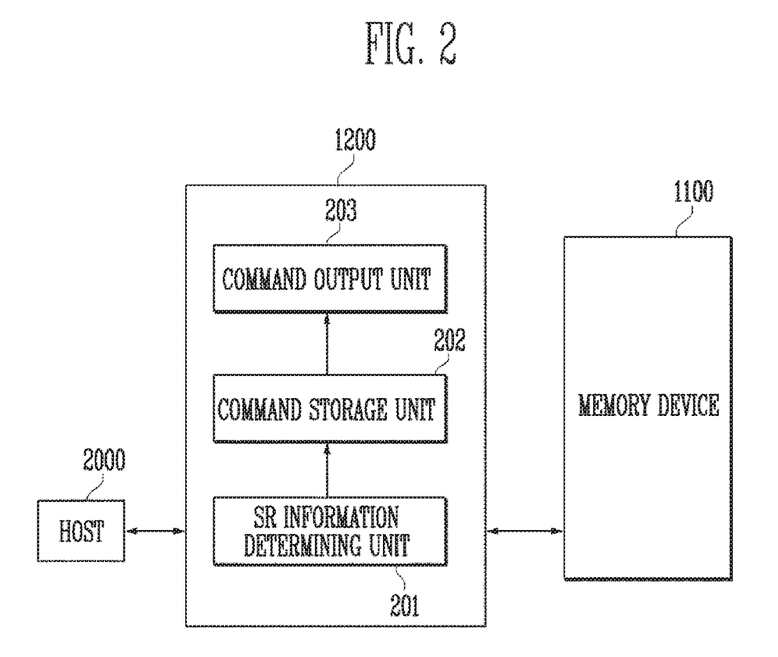
FIG. 2 is a diagram illustrating an example of the controller of FIG. 1.

FIG. 2 is a diagram illustrating an example of the controller of FIG. 1.

Referring to FIG. 2, the memory system 1000 may include the memory device 1100 for storing data and the controller 1200 for controlling the memory device 1100. The controller 1200 may include a status/read (SR) information determining circuit 201, a command storage circuit 202, and a command output circuit 203.

The SR information determining circuit 201 may determine a status of a selected memory chip, and may output a command selecting signal in accordance with SR information received from the selected memory chip. The SR information may include information on a read operation status of the selected memory chip. The command storage circuit 202 may store commands for performing various operations and select a command in accordance with the command selecting signal. For example, examples of the commands may include a normal read command, a read ready command, an advanced one-shot read command, setup commands, and a data output command. The command output circuit 203 may transmit the selected command to the selected memory chip so that the selected memory chip may perform a selected operation.

Figure 3:
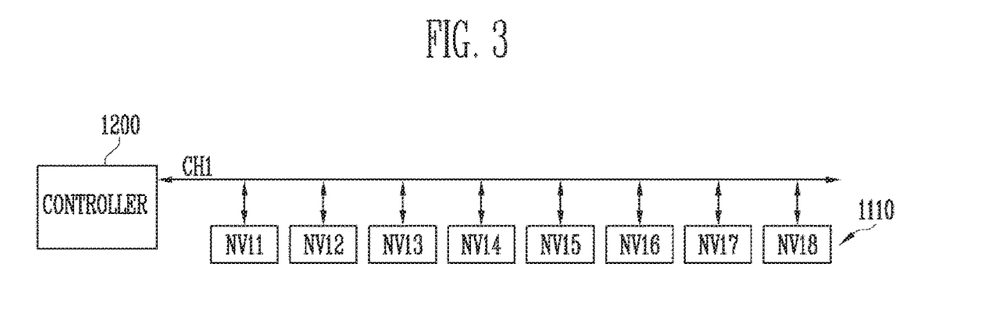
FIG. 3 is a diagram illustrating an example of the memory group of FIG. 1.

FIG. 3 is a diagram illustrating an example of the memory group of FIG. 1.

FIG. 3 illustrates, among the memory groups 1110, 1120, and 11k0 illustrated in FIG. 1, a connection relationship between the first memory group 1110 and the controller 1200. The remaining memory groups (i.e., 1120 to 11k0 of FIG. 1) may be connected to the controller 1200 like the first memory group 1110 illustrated in FIG. 3.

The first memory group 1110 may include a plurality of memory chips NV11 to NV18 coupled in common to the first channel CH1. Although FIG. 3 illustrates only eight memory chips NV11 to NV18 for the sake of convenience, the first memory group 1110 may include a larger number of memory chips. The first channel CH1 may include a plurality of transmission lines communicationally coupling the controller 1200 to the plurality of memory chips NV11 to NV18. For example, the first channel CH1 may include a plurality of transmission lines through which a chip enable signal, a command latch enable signal, an address latch enable signal, a write enable signal, a ready busy signal, a command, an address, and data are transmitted.

Figure 4:
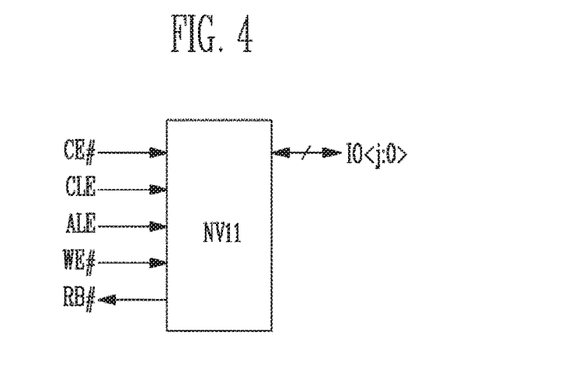
FIG. 4 is a diagram illustrating an example of the memory chip of FIG. 3.

FIG. 4 is a diagram illustrating an example of the memory chip of FIG. 3. Although FIG. 4 illustrates only one memory chip (i.e., a first memory chip NV11), the remaining memory chips (e.g., second to eighth memory chips NV12 to NV18 of FIG. 3) may be configured in the same way as the first memory chip NV11.

Referring to FIG. 4, the first memory chip NV11 may receive the chip enable signal CE#, the command latch enable signal CLE, the address latch enable signal ALE, and the write enable signal WE# and may output the ready busy signal RB# through the plurality of transmission lines included in the first channel (CH1 of FIG. 3). The chip enable signal CE# may be selectively applied to the memory chips NV11 to NV18 through the transmission lines respectively connected to the memory chips NV11 to NV18 connected to the first channel CH1. The remaining signals CLE, ALE, WE#, and RB# are applied to the transmission lines commonly connected to the memory chips NV11 to NV18. The respective signals will be specifically described as follows.

The chip enable signal CE#, which is selectively input to a plurality of storage devices coupled to the first channel CH1, may be used for inputting the command, the address, or the data to the selected memory chip NV11. For example, the chip enable signal CE# may be applied to the selected memory chip NV11 at a low level (e.g. a logic low level), and may be applied to the remaining non-selected memory chips NV12 to NV18 at a high level (e.g., a logic high level). The command latch enable signal CLE may be at a high level while the command is being input to the memory chip NV11. The address latch enable signal ALE may be at a high level while the address ADD is being input to the memory chip NV11. The ready busy signal RB# may be at a low level while the selected memory chip NV11 is performing an operation. The write enable signal WE# is transitioned from a high level to a low level when a command loaded on input and output lines IO<1:0>, an address, or data is input to the selected memory chip NV11.

Input and output lines IO<j:0> included in the first channel CH1 may be used for transmitting and receiving the command, the address, and the data between the controller 1200 and the memory chip NV11.

Figure 5:
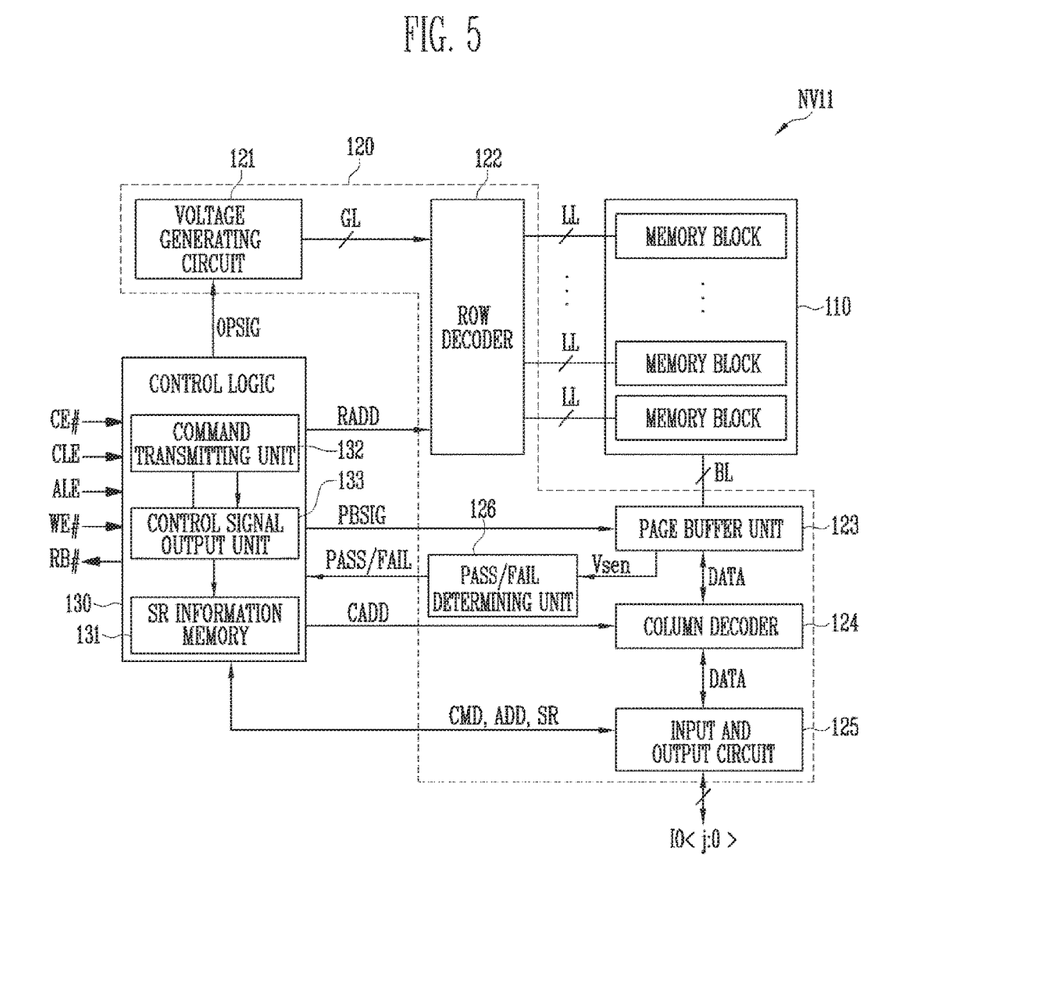
FIG. 5 is a diagram illustrating an example of the memory chip of FIG. 4.

FIG. 5 is a diagram illustrating an example of the memory chip of FIG. 4. Memory chips may include one or both of volatile memory chips and non-volatile memory chips. For example, the non-volatile memory chips may be used for data storage devices of the portable electronic devices. FIG. 5 illustrates a non-volatile memory chip having a plurality of memory blocks (e.g., a NAND flash memory chip) as an example.

Referring to FIG. 5, the first memory chip NV11 may include a memory cell array 110 for storing data, a peripheral circuit 120 for performing a program operation, a read operation, and an erase operation of the memory cell array 110, and a control logic 130 for controlling the peripheral circuit 120.

The memory cell array 110 may include a plurality of memory blocks for storing data. Each of the memory blocks may include a plurality of cell strings (not illustrated) including memory cells.

The peripheral circuit 120 may include a voltage generating circuit 121, a row decoder 122, a page buffer circuit 123, a column decoder 124, and an input and output circuit 125.

The voltage generating circuit 121 may generate operation voltages at various levels in response to an operation signal OPSIG, and may transmit the generated operation voltages to global lines GL.

The row decoder 122 may transmit the operation voltages to local lines LL coupled to a selected memory block in response to a row address RADD.

The page buffer circuit 123 temporarily stores data DATA transmitted from the column decoder 124 in response to a page buffer control signal PBSIG. The page buffer circuit 123 may also temporarily store data transmitted through bit lines BL. In addition, during the read operation, the page buffer circuit 123 may 'sense' data of a selected page, may temporarily store the sensed data, and may output the temporarily stored data to the column decoder 124 in response to the page buffer control signal PBSIG. In the read operation of triple-level cells (TLC) which can store three bits of data per cell, the page buffer circuit 123 may temporarily store the 'sensed' data read-out from a page. The triple-level cells (TLC) may be divided into logical pages including a least significant bit (LSB) page, a center significant bit (CSB) page, and a most significant bit (MSB) page. Therefore, during the read operation, the page buffer circuit 123 may store data corresponding to the LSB page, the CSB page, and the MSB page. The operation of the page buffer circuit 123 discussed above may also be applied to multi-level cells (MLC) or quadruple-level cells (QLC). Here, the multi-level cells (MLC) can store two bits of data per cell, and the quadruple-level cells (QLC) can store four bits of data per cell.

The column decoder 124 may exchange data DATA with the page buffer circuit 123 or the input and output circuit 125 in response to a column address CADD. For example, the column decoder 124 may transmit the data DATA output from the page buffer circuit 123 to the input and output circuit 125 during the read operation.

The input and output circuit 125 may be coupled to the controller (1200 of FIG. 1) through the input and output lines IO<j:0>. The input and output circuit 125 may transmit the command CMD and the address ADD, which were received from the controller 1200, to the control logic 130, may transmit the data DATA, which was received from the controller 1200, to the column decoder 124, and may output the data DATA, which was received from the column decoder 124, to the controller 1200 through the input and output lines IO<j:0>. In addition, the input and output circuit 125 may receive SR information output from the control logic 130, and may output the received SR information to the controller 1200 through the input and output lines IO<j:0>.

During the program operation, a pass/fail determining circuit 126 may receive a sensing voltage Vsen from the page buffer circuit 123, and may determine whether the program operation for a certain memory cell has passed or failed verification. The pass/fail determining circuit 126 may output a pass signal PASS when the program operation for a certain memory cell has passed verification, and may output a fail signal FAIL when the program operation for a certain memory cell has failed verification.

The control logic 130 may output the operation signal OPSIG, the row address RADD, the page buffer control signal PBSIG, and the column address CADD in response to the command CMD and the address ADD. During the read operation, the control logic 130 may perform a sensing operation on a selected page, may output the sensed data, and may control the peripheral circuit 120 so that the sensing operation and the output operation may be simultaneously performed in response to the command CMD and the address ADD. The control logic 130 may include an SR information memory 131, a command transmitting circuit 132, and a control signal output circuit 133. The SR information memory 131 may store the SR information representing a current status of the memory chip NV11, and may update the SR information in accordance with the status of the memory chip NV11. In addition, the SR information memory 131 may output the SR information in response to the command CMD requesting the SR information. The command transmitting circuit 132 may output an operation determining signal to the SR information memory 131 or the control signal output circuit 133 in response to the received command CMD. For example, in response to the command CMD requesting the SR information, the command transmitting circuit 132 may transmit the received command to the SR information memory 131. When the command CMD requesting the SR information is transmitted to the SR information memory 131, the SR information memory 131 may output the SR information. In addition, in response to the command CMD for the read operation, the command transmitting circuit 132 may transmit the received command to the control signal output circuit 133. The control signal output circuit 133 may output the control signals OPSIG and PBSIG for controlling operations and the addresses RADD and CADD in response to the command CMD received from the command transmitting circuit 132.

Figure 6:
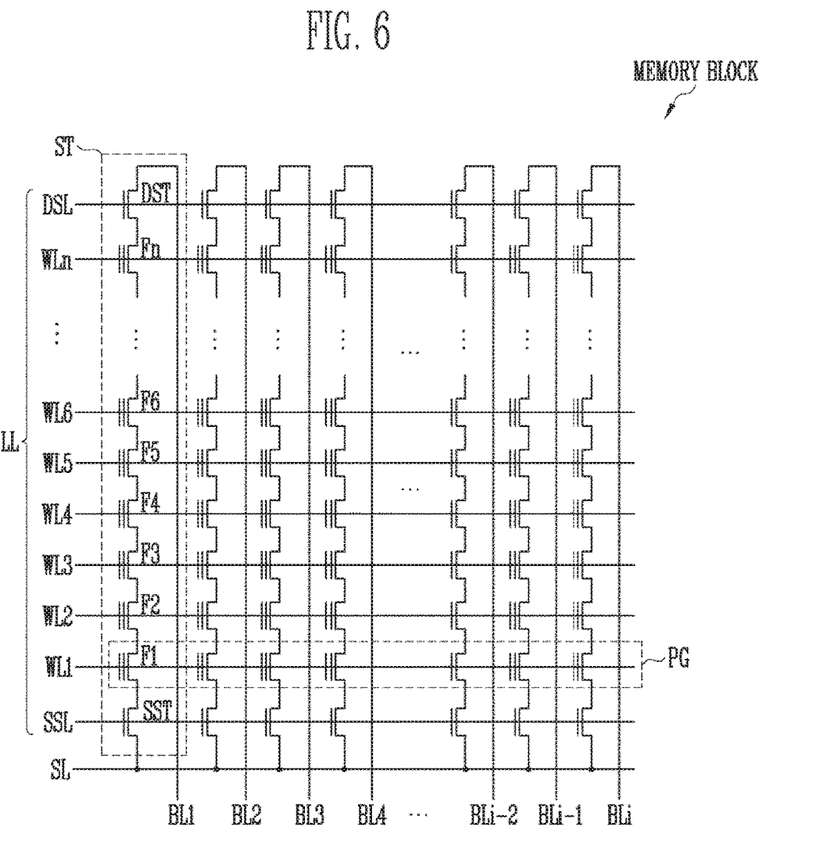
FIG. 6 is a diagram illustrating an example of the memory block of FIG. 5.

FIG. 6 is a diagram illustrating an example of the memory block of FIG. 5.

Referring to FIG. 6, a memory block may include a plurality of strings ST connected between first to ith bit lines BL1 to BLi (I is a positive integer) and a source line SL. Among the strings ST, the string ST connected to the first bit line BL1 will be described.

The string ST may include a source select transistor SST, first to nth memory cells F1 to Fn (n is a positive integer), and a drain select transistor DST, which are serially connected between the source line SL and the first bit line BL1. A gate of the source select transistor SST may be coupled to a source select line SSL, gates of the first to nth memory cells F1 to Fn may be coupled to first to nth word lines WL1 to WLn, and a gate of the drain select transistor DST may be coupled to a drain select line DSL. A group of memory cells coupled to different strings ST may be referred to as a page PG, and each page PG may include a plurality of logical pages. How many logical pages each page PG includes may vary depending on how the first to nth memory cells F1 to Fn are programmed. For example, the MLC may include two logical pages, the TLC may include three logical pages, and the QLC may include four logical pages.

Figure 7:
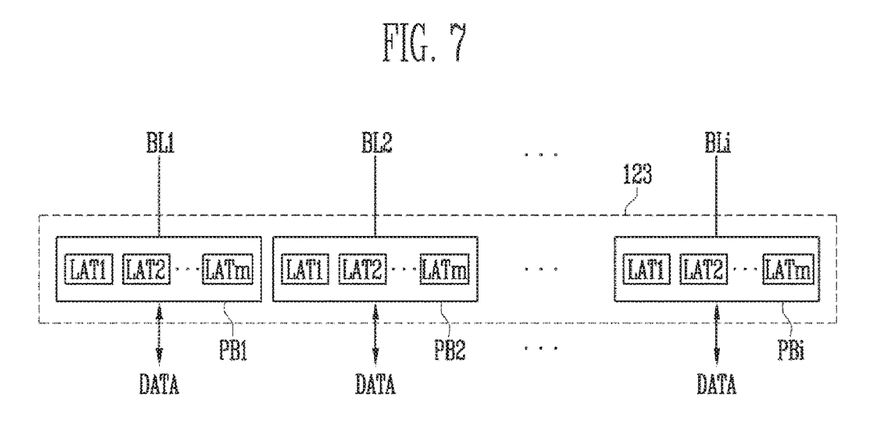
FIG. 7 is a diagram illustrating an example of the page buffer circuit of FIG. 5.

FIG. 7 is a diagram illustrating an example of the page buffer circuit of FIG. 5.

Referring to FIG. 7, the page buffer circuit 123 may include first to ith page buffers PB1 to PBi. The first to ith page buffers PB1 to PBi may be coupled to the first to ith bit lines BL1 to BLi. Each of the first to ith page buffers PB1 to PBi may include first to mth latches LAT1 to LTm (m is a positive integer) for sensing and storing data. For example, a page buffer for the MLC may have two or more latches, a page buffer for the TLC may have three or more latches, and a page buffer for the QLC may have four or more latches.

A read operation of the TLC will be described.

Figure 8:
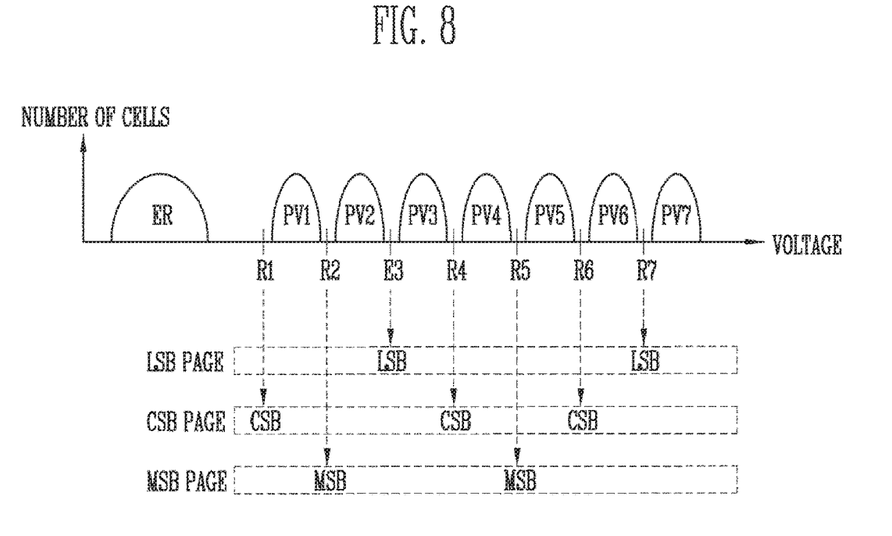
FIG. 8 is a diagram illustrating an example of logical pages of triple-level cells (TLC).

FIG. 8 is a diagram illustrating an example of logical pages of TLCs.

Referring to FIG. 8, the TLC may include three logical pages, which are the LSB, CSB, and MSB pages. The three logical pages of the TLC may have eight threshold voltage distributions. For example, the TLC may be programmed into one of an erase status ER and seven program statuses PV1 to PV7. In order to read the TLC including the three logical pages LSB, CSB, and MSB, read operations may be performed on the respective logical pages. That is, LSB data may be obtained by an LSB read operation, CSB data may be obtained by a CSB read operation, and MSB data may be obtained by an MSB read operation. The LSB read operation may be performed by using third and seventh read voltages R3 to R7, the CSB read operation may be performed by using first, fourth, and sixth read voltages R1, R4, and R6, and the MSB read operation may be performed by using second and fifth read voltages R2 and R5. The read voltages used for the LSB, CSB, and MSB read operations may vary in accordance with a memory chip.

The LSB data read by the LSB read operation may be stored by the first latch (e.g., LAT1 of FIG. 7) of a page buffer. The CSB data read by the CSB read operation may be stored in the second latch (e.g., LAT2 of FIG. 7) of the page buffer. The MSB data read by the MSB read operation may be stored in the third latch (e.g., LAT3 of FIG. 7) of the page buffer.

Before storing the LSB data, the CSB data or the MSB data in the respective latches LAT1 to LAT3, a sensing operation may be performed on selected memory cells. That is, a change in voltage or current of the bit lines in accordance with threshold voltages of the selected memory cells may be sensed and data corresponding to the change may be stored in the latches corresponding to the respective logical pages.

According to an embodiment, before all the sensing operations on the LSB page, the CSB page, and the MSB page is completed, data output from logical pages on which the sensing operation has been completed may be performed. That is, in a certain time period of the sensing operation, the sensing operation and the output operation may be simultaneously performed.

Figure 9:
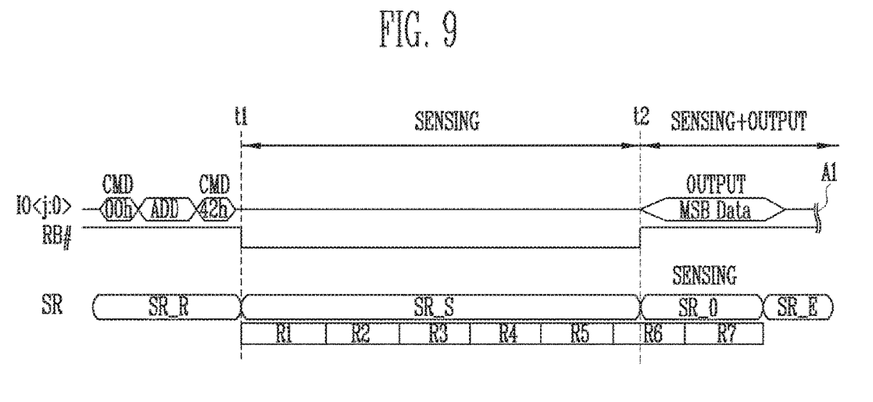
FIGS. 9 and 10 are diagrams illustrating an example of a read operation according to an embodiment of the present invention.
Figure 10:
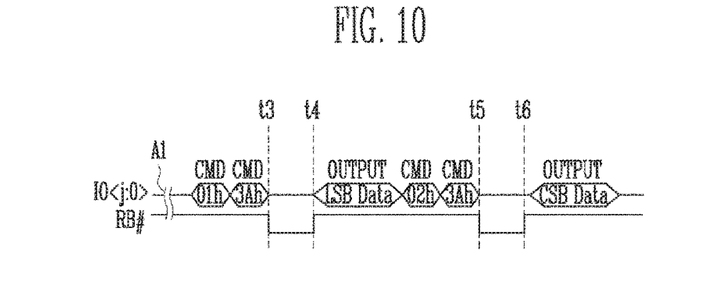

FIGS. 9 and 10 are diagrams illustrating an example of a read operation according to an embodiment of the present invention.

Referring to FIG. 9, when a read operation starts, SR information of a memory chip may be updated to first SR information SR_R representing that the command CMD, the address ADD, or the data DATA may be received. When the first SR information SR_R is stored in the memory chip, the memory chip may output a ready busy signal RB# at a high level and inform the controller that the memory chip may receive the command CMD or the address ADD. The controller may sequentially transmit a read preparing command 00h, the address ADD, and an advanced one-shot read command 42h to the selected memory chip through the input and output lines IO<j:0>. The memory chip may prepare to perform the read operation in response to the read preparing command 00h and the address ADD, and may set a memory block to perform the read operation thereon.

The memory chip performs the advanced one-shot read operation from a first point in time t1 in response to the advanced one-shot read command 42h. In the advanced one-shot read operation, before the sensing operation of the logical pages is completed, a partial sensing operation and an output operation may be simultaneously performed.

While the sensing operation is performed t1 to t2, the SR information of the memory chip may be updated to second SR information SR_S representing that the command CMD, the address ADD, or the data DATA may not be received. For example, at the first point in time t1 at which the sensing operation starts, the SR information may be updated. When the second SR information SR_S is stored in the memory chip, the memory chip may output the ready busy signal RB# at a low level and inform the controller that the memory chip may not transmit the command CMD, the address ADD, or the data DATA.

The sensing operation may be performed by sequentially using the first to seventh read voltages R1 to R7. The first to seventh read voltages R1 to R7 may be set in the order in which a lowest voltage level comes first. For example, the first read voltage R1 may be set to be lowest and the seventh read voltage R7 may be set to be highest. The sensing operation may include applying the read voltage to a selected word line and storing data in logical pages of memory cells in accordance with voltages or currents of the bit lines. For example, when the first read voltage R1 is applied to a selected word line, the voltages or currents of the bit lines may be maintained as they are or may be reduced in accordance with threshold voltages of memory cells included in a selected page. In accordance with a difference in voltage or current of the bit lines, data of logical pages read from the selected page is stored in the page buffers. In such a method, the sensing operation may be performed by using the first to fifth read voltages R1 to R5.

When the sensing operation using the first to fifth read voltages R1 to R5 is completed, since a sensing operation of the MSB page of the selected page is completed, MSB data may be stored in the third latches of the page buffers. That is, as illustrated in FIG. 8, in the case in which the read voltages of the MSB page are set as the second and fifth read voltages R2 and R5, when the sensing operation using the first to fifth read voltages R1 to R5 is completed, the sensing operation for the MSB page using the second and fifth read voltages R2 and R5 is completed. At this time, the sensing operation using the third read voltage R3 has already completed, whereas the sensing operation using the seventh read voltage R7 is not yet performed. Therefore, the sensing operation for the LSB page is not completed. In addition, the sensing operation using the first to fourth read voltages R1 to R4 is completed. However, since the sensing operation using the sixth read voltage R6 is not yet completed, the sensing operation for the CSB page is not completed.

When the MSB data is stored in the third latches of the page buffers, since the sensing operation for the MSB page is not further performed, while the sensing operations for the remaining LSB and CSB pages are being performed, MSB data may be output through the input and output lines IO<j:0>.

A second point in time t2 at which the MSB data is output may be determined in accordance with time information previously set in the memory chip. The time information may be used for the sensing operation by the advanced one-shot read command 42h. That is, if the memory chip receives a normal read command instead of the advanced one-shot read command 42h, the memory chip may perform a normal read operation.

At the second point in time t2 at which the MSB data is output, the SR information of the memory chip is updated to third SR information SR_O representing that the sensing operation and the output operation are simultaneously performed. Since the MSB data may be output from the second point in time t2, the memory chip may output the ready busy signal RB# at a high level.

Since the second point in time t2 is after the sensing operation using the fifth read voltage R5 is completed, the second point in time t2 may be set within a time period for which the sensing operation using the sixth read voltage R6 is performed.

While the sensing operation using the sixth read voltage R6 is being performed, the memory chip may output the MSB data stored in the third latches of the page buffers through the input and output lines IO<j:0>. For example, when the third latches are output latches coupled to the column decoder (e.g., 124 of FIG. 5), the MSB data stored in the third latches may be transmitted to the input and output circuit (e.g., 125 of FIG. 5) through the column decoder (e.g., 124 of FIG. 5). The input and output circuit 125 may output the received MSB data through the input and output lines IO<j:0>.

While an output operation of the MSB data is performed, the sensing operation using the sixth read voltage R6 may be performed. When the sensing operation using the sixth read voltage R6 is completed, the sensing operation using the seventh read voltage R7 may be performed.

When the sensing operation using the seventh read voltage R7 is completed, since the sensing operations of the LSB, CSB, and MSB pages are completed, the SR information of the memory chip may be updated to fourth SR information SR_E representing that the sensing operation is completed. At this time, the ready busy signal RB# may be maintained at the high level.

As described above, since the partial sensing operation and the output operation may be simultaneously performed, the read operation time of the selected page may be reduced.

An operation A1 after the MSB data is output will be described with reference to FIG. 10.

Referring to FIG. 10, when all the MSB data is output A1, the remaining LSB and CSB data stored in the latches of a page buffer may be sequentially output.

The controller may sequentially transmit an LSB setup command 01h and a data output command 3Ah to the memory chip through the input and output lines IO<j:0>. The memory chip may be set such that the LSB data stored in the first latches of the page buffers may be output in response to the LSB setup command 01h. The memory chip may transmit the LSB data stored in the first latches to the output latches included in the page buffers in response to the data output command 3Ah. Here, the output latches may store data of logical pages output first during the read operation. For example, the output latches may be the third latches. While the LSB data is being transmitted from the first latches to the output latches t3 to t4, the memory chip may output the ready busy signal RB# at a low level.

When all the LSB data is transmitted to the output latches t4, the memory chip may transition the ready busy signal RB# to a high level and output the LSB data stored in the output latches of the page buffers through the input and output lines IO<j:0>. For example, the SLB data stored in the output latches may be transmitted to the input and output circuit (e.g., 125 of FIG. 5) through the column decoder (e.g., 124 of FIG. 5). The input and output circuit 125 may output the received LSB data through the input and output lines IO<j:0>.

When all the LSB data is transmitted to the controller, the controller may sequentially transmit a CSB setup command 02h and a data output command 3Ah to the memory chip through the input and output lines IO<j:0>. The memory chip may be set such that the CSB data stored in the second latches of the page buffers may be output in response to the CSB setup command 02h. The memory chip may transmit the CSB data stored in the second latches to the output latches included in the page buffers in response to the output command 3Ah. Here, the data of the logical pages output first during the read operation may be stored in the output latches. For example, the output latches may be the third latches. While the CSB data is being transmitted from the second latches to the output latches t5 to t6, the memory chip may output the ready busy signal RB# at a low level.

If all the CSB data is transmitted to the output latches t6, the memory chip may transition the ready busy signal RB# to a high level and output the CSB data stored in the output latches of the page buffers through the input and output lines IO<j:0>. For example, the CSB data stored in the output latches may be transmitted to the input and output circuit (e.g., 125 of FIG. 5) through the column decoder (e.g., 124 of FIG. 5). The input and output circuit 125 may output the received CSB data through the input and output lines IO<j:0>.

When all the CSB data is transmitted to the controller, the read operation of the selected page is completed.

According to an embodiment, the LSB data and the CSB data may be sequentially output after the MSB data is output. However, the order in which the LSB data and the CSB data are output may vary in accordance with a memory chip.

In addition, according to an embodiment, during the sensing operation, the first to seventh read voltages R1 to R7 may be sequentially used. However, the order of the read voltages may vary in accordance with a memory chip.

Figure 11:
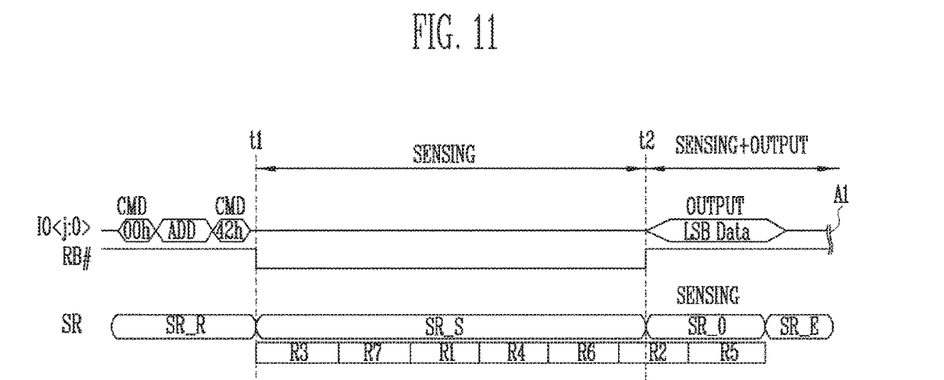
FIGS. 11 and 12 are diagrams illustrating an example of a read operation according to an embodiment of the present invention.
Figure 12:
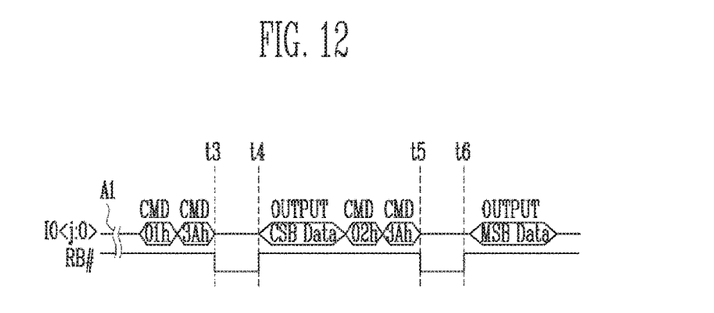

FIGS. 11 and 12 are diagrams illustrating an example of a read operation according to an embodiment of the present invention.

Referring to FIG. 11, when a read operation starts, SR information of a memory chip may be updated to first SR information SR_R representing that the command CMD, the address ADD, or the data DATA may be received. When the first SR information SR_R is stored in the memory chip, the memory chip may output a ready busy signal RB# at a high level and inform the controller that the memory chip may receive the command CMD or the address ADD. The controller may sequentially transmit a read preparing command 00h, the address ADD, and an advanced one-shot read command 42h to the memory chip selected through the input and output lines IO<j:0>. The memory chip may prepare to perform the read operation in response to the read preparing command 00h and the address ADD, and may set a memory block to perform the read operation thereon.

The memory chip performs the advanced one-shot read operation from a first point in time t1 in response to the advanced one-shot read command 42h. In the advanced one-shot read operation, before the sensing operation of the logical pages is completed, a partial sensing operation and an output operation may be simultaneously performed.

While the sensing operation is performed t1 to t2, the SR information of the memory chip may be updated to second SR information SR_S representing that the command CMD, the address ADD, or the data DATA may not be received. For example, at the first point in time t1 at which the sensing operation starts, the SR information may be updated. When the second SR information SR_S is stored in the memory chip, the memory chip may output the ready busy signal RB# at a low level and informs the controller that the memory chip may not transmit the command CMD, the address ADD, or the data DATA.

The sensing operation may be performed by using the first to seventh read voltages R1 to R7 of which the order is set in accordance with logical pages. For example, the LSB sensing operation may be performed by using the third and seventh read voltages R3 and R7, the CSB sensing operation may be performed by using the first, fourth, and sixth read voltages R1, R4, and R6, and the MSB sensing operation may be performed by using the second and fifth read voltages R2 and R5. When the read voltages used for sensing operations of all the logical pages are set, the sensing operation may be performed by using the read voltages divided on a logical page basis. For example, the sensing operation may be performed in the order of the LSB sensing operation, the CSB sensing operation, and the MSB sensing operation. For this purpose, the read voltages may be used for the LSB sensing operation, the CSB sensing operation, and the MSB sensing operation in the order of the LSB sensing operation, the CSB sensing operation, and the MSB sensing operation. For example, the read voltages may be set such that the third and seventh read voltages R3 and R7 for the LSB sensing operation, the first, fourth, and sixth read voltages R1, R4, and R6 for the CSB sensing operation, and the second and fifth read voltages R2 and R5 for the MSB sensing operation are sequentially used.

The sensing operation may include applying the read voltage to a selected word line and storing data in logical pages of memory cells in accordance with voltages or currents of the bit lines. For example, when the third read voltage R3 is applied to a selected word line, the voltages or currents of the bit lines may be maintained as they are or may be reduced in accordance with threshold voltages of memory cells included in a selected page. In accordance with a difference in voltage or current of the bit lines, data of logical pages read from the selected page is stored in the page buffers. In such a method, the sensing operations in which the third, seventh, first, fourth, and sixth read voltages R3, R7, R1, R4, and R6 are sequentially used may be performed.

When the sensing operations using the third, seventh, first, fourth, and sixth read voltages R3, R7, R1, R4, and R6 may be completed, since sensing operations of the LSB and CSB pages of the selected page are completed, the LSB data and the CSB data may be respectively stored in the first and second latches of the page buffers.

When the data items of the LSB and CSB pages are respectively stored in the first and second latches of the page buffers, since the operations of sensing the LSB and CSB pages are not further performed, while the sensing operation of the remaining MSB page is being performed, the LSB data or the CSB data may be output through the input and output lines IO<j:0>. The order in which the data of sensing-operation-completed logical pages are output may vary in accordance with a memory chip. According to an embodiment, a case in which the LSB data is output prior to the CSB data will be taken as an example.

A second point in time t2 at which the MSB data is output may be determined in accordance with time information previously set in the memory chip. The time information may be used for the sensing operation by the advanced one-shot read command 42h. That is, if the memory chip receives a normal read command instead of the advanced one-shot read command 42h, the memory chip may perform the normal read operation.

At the second point in time t2 at which the LSB data is output, the SR information of the memory chip is updated to third SR information SR_O representing that the sensing operation and the output operation are simultaneously performed. Since the LSB data may be output from the second point in time t2, the memory chip may output the ready busy signal RB# at a high level.

Since the second point in time t2 is after the sensing operation using the sixth read voltage R6 is completed, the second point in time t2 may be set within a time period for which the sensing operation using the second read voltage R2 is performed.

While the sensing operation using the second read voltage R2 is being performed, the memory chip may output the LSB data stored in the first latches of the page buffers through the input and output lines IO<j:0>. For example, when the first latches are output latches coupled to the column decoder (e.g., 124 of FIG. 5), the LSB data stored in the first latches may be transmitted to the input and output circuit (e.g., 125 of FIG. 5) through the column decoder (e.g., 124 of FIG. 5). The input and output circuit 125 may output the received MSB data through the input and output lines IO<j:0>.

While an output operation of the LSB data is performed, the sensing operation using the second read voltage R2 may be performed. When the sensing operation using the second read voltage R2 is completed, the sensing operation using the fifth read voltage R5 may be performed.

When the sensing operation using the fifth read voltage R5 is completed, since the sensing operations of the LSB, CSB, and MSB pages are completed, the SR information of the memory chip may be updated to fourth SR information SR_E representing that the sensing operation is completed. At this time, the ready busy signal RB# may be maintained at the high level.

As described above, since the partial sensing operation and the output operation may be simultaneously performed, the read operation time of the selected page may be reduced.

An operation A1 after the LSB data is output will be described with reference to FIG. 12.

Referring to FIG. 12, when all the LSB data is output A1, the remaining CSB and MSB data stored in the latches of a page buffer may be sequentially output.

The controller may sequentially transmit a CSB setup command 01h and a data output command 3Ah to the memory chip through the input and output lines IO<j:0>. The memory chip may be set such that the CSB data stored in the second latches of the page buffers may be output in response to the CSB setup command 01h. The memory chip may transmit the CSB data stored in the second latches to the output latches included in the page buffers in response to the data output command 3Ah. Here, the output latches may store data of logical pages output first during the read operation. For example, the output latches may be the first latches. While the CSB data is being transmitted from the second latches to the output latches t3 to t4, the memory chip may output the ready busy signal RB# at a low level.

When all the CSB data is transmitted to the output latches t4, the memory chip may transition the ready busy signal RB# to a high level and output the CSB data stored in the output latches of the page buffers through the input and output lines IO<j:0>. For example, the CLB data stored in the output latches may be transmitted to the input and output circuit (e.g., 125 of FIG. 5) through the column decoder (e.g., 124 of FIG. 5). The input and output circuit 125 may output the received CSB data through the input and output lines IO<j:0>.

When all the CSB data is transmitted to the controller, the controller may sequentially transmit a MSB setup command 02h and a data output command 3Ah to the memory chip through the input and output lines IO<j:0>. The memory chip may be set such that the MSB data stored in the third latches of the page buffers may be output in response to the MSB setup command 02h. The memory chip may transmit the MSB data stored in the third latches to the output latches included in the page buffers in response to the output command 3Ah. Here, the data of the logical pages output first during the read operation may be stored in the output latches. For example, the output latches may be the first latches. While the MSB data is being transmitted from the third latches to the output latches t5 to t6, the memory chip outputs the ready busy signal RB# at a low level.

If all the MSB data is transmitted to the output latches t6, the memory chip may transition the ready busy signal RB# to a high level and output the MSB data stored in the output latches of the page buffers through the input and output lines IO<j:0>. For example, the MSB data stored in the output latches may be transmitted to the input and output circuit (e.g., 125 of FIG. 5) through the column decoder (e.g., 124 of FIG. 5). The input and output circuit 125 may output the received MSB data through the input and output lines IO<j:0>.

When all the MSB data is transmitted to the controller, the read operation of the selected page is completed.

Since the above-described 00h, 42h, 01h, 02h, and 3Ah of FIGS. 9 to 12 are reference numerals of commands for facilitating the understanding of the embodiments, the present invention is not limited thereto. In addition, the above-described read operation may be applied to a memory system including logical pages of two or more bits.

Figure 13:
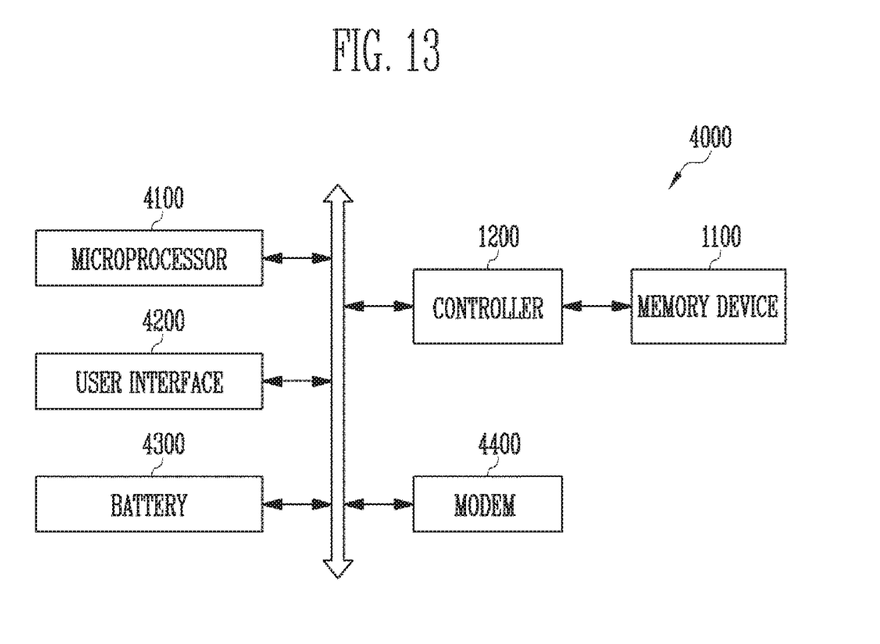
FIG. 13 is a schematic diagram illustrating an example configuration of a computing system including a memory system according to an embodiment of the present invention.

FIG. 13 is a schematic diagram illustrating an example configuration of a computing system including a memory system 4000 according to an embodiment of the present invention.

Referring to FIG. 13, the memory system 4000 according to an embodiment of the present invention may include the memory device 1100, the controller 1200, a microprocessor 4100, a user interface 4200, and a modem 4400, which are electrically connected to a bus. In addition, when the memory system 4000 according to an embodiment of the present invention is a mobile device, a battery 4300 for supplying an operation voltage of the memory system 4000 may be further included. Although not illustrated, the memory system 4000 according to an embodiment of the present invention may further include an application chipset, a CMOS image processor (CIS), and a mobile dynamic random access memory (mobile DRAM). The controller 1200 and the memory device 1110 may form a solid state drive/disk (SSD).

The memory system 4000 according to an embodiment of the present invention may be made by using various types of packages. For example, the memory system 4000 according to an embodiment of the present invention may be made by using the packages such as a package to package (PoP), ball grid arrays (BGAs), chip scale packages (CSPs), plastic leaded chip carrier (PLCC), a plastic dual in-line package (PDIP), a die in waffle pack, a die in wafer form, a chip on board (COB), a ceramic dual in-line package (CERDIP), plastic metric quad flat pack (MQFP), a thin quad flat pack (TQFP), a small outline (SOIC), a shrink small outline package (SSOP), a thin small outline (TSOP), a system in package (SIP), multichip package (MCP), a wafer-level fabricated package (WFP), and a wafer-level processed stack package (WSP).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory system comprising:
   a memory chip configured to perform a sensing operation on logical pages included in a selected page in response to a first command and to simultaneously perform sensing operations on remaining logical pages of the selected page while outputting data of a logical page having completed a sensing operation among the logical pages in response to a second command, the memory chip updating status/read (SR) information depending on what operations were performed; and
   a controller configured to store the first command and the second command and to output the first command or the second command in accordance with the SR information.

2. The memory system of claim 1, wherein the memory chip comprises:
   a memory cell array including a plurality of pages including the selected page;
   a peripheral circuit configured to store the data by performing the sensing operation on the selected page in response to control signals and to simultaneously perform the sensing operations on the remaining logical pages of the selected page while outputting the data; and
   a control logic configured to output the control signals for controlling the peripheral circuit in response to the first command or the second command.

3. The memory system of claim 2, wherein the peripheral circuit comprises page buffers including a plurality of latches configured to store the data sensed from the logical pages.

4. The memory system of claim 3, wherein the logical pages comprise a least significant bit (LSB) page, a center significant bit (CSB) page, and a most significant bit (MSB) page.

5. The memory system of claim 4, wherein the latches comprise:
   first latches configured to store data of the LSB page;
   second latches configured to store data of the CSB page; and
   third latches configured to store data of the MSB page.

6. The memory system of claim 2, wherein the control logic comprises:
   an SR information memory configured to store the SR information;
   a control signal output circuit configured to output the control signals required for a read operation; and
   a command transmitting circuit configured to transmit the first command to the SR information memory or to transmit the second command to the control signal output circuit by receiving the first command or the second command.

7. The memory system of claim 1, wherein the controller comprises:

an SR information determining circuit configured to determine a status of the memory chip and to output a command selecting signal in accordance with the SR information;

a command storage circuit configured to store the first and second commands and to select the first command or the second command in response to the command selecting signal; and a command output circuit configured to output a command selected from the first and second commands to the memory chip.

8. The memory system of claim 7, wherein the command output circuit further comprises various commands corresponding to various operations other than the first and second commands.

9. The memory system of claim 1, wherein, when the data of the logical page having completed the sensing operation is output, the controller controls the memory chip so that data of the remaining logical pages is output.

10. A method of operating a memory system, the method comprising:

performing a sensing operation on a selected page including a plurality of logical pages by using read voltages having various levels; and simultaneously performing an output operation of data of a logical page having completed a sensing operation and sensing operations on remaining logical pages.

11. The method of claim 10, wherein performing the sensing operation on the selected page comprises respectively applying the read voltages to a word line coupled to the selected page in a predetermined order and respectively storing sensed data.

12. The method of claim 11, wherein the sensed data are divided on a logical page basis and are respectively stored in a plurality of latches.

13. The method of claim 10, wherein the logical pages comprise an LSB page, a CSB page, and an MSB page.

14. The method of claim 10, further comprising performing an output operation of data of other logical pages having completed their sensing operations, among the remaining logical pages after simultaneously performing the sensing operation and the output operation.

15. A method of operating a memory system, the method comprising:

performing a sensing operation on a plurality of logical pages of a selected page in response to a read command;

outputting data of a logical page having completed a sensing operation while performing a sensing operation on remaining logical pages of the selected page; and sequentially outputting data of the remaining logical pages in response to setup commands and an output command.

16. The method of claim 15, wherein the sensing operation of the plurality of logical pages is performed by using read voltages having various levels corresponding to the logical pages.

17. The method of claim 16, wherein the read voltages are used during the sensing operation in a predetermined order.

18. The method of claim 15, wherein, while the data of the logical page having completed the sensing operation is being output, a sensing operation of the remaining logical pages is completed.

19. The method of claim 18, further comprising sequentially outputting the data of the remaining logical pages after the sensing operation of the remaining logical pages is completed.

20. The method of claim 19, wherein sequentially outputting the data of the remaining logical pages comprises:

selecting one of the remaining logical pages in response to a first setup command;

transmitting, to output latches, first data of the logical page selected in accordance with the first setup command;

outputting the first data transmitted to the output latches;

selecting another logical page among the remaining logical pages in response to a second setup command;

transmitting, to the output latches, second data of the logical page selected in accordance with the second setup command in response to the output command; and outputting the second data transmitted to the output latches.

* * * * *